United States Patent [19]
Zucker et al.

[11] Patent Number: 5,278,818
[45] Date of Patent: Jan. 11, 1994

[54] MAGNETO-OPTICAL RECORDING CIRCUITRY FOR REVERSING A MAGNETIC FIELD

[75] Inventors: Friedhelm Zucker, Mönchweiler; Christian Büchler, VS-Marbach, both of Fed. Rep. of Germany

[73] Assignee: Deutsche Thomson-Brandt GmbH, Hanover, Fed. Rep. of Germany

[21] Appl. No.: 690,955
[22] PCT Filed: Nov. 17, 1989
[86] PCT No.: PCT/EP89/01391
 § 371 Date: Jun. 17, 1991
 § 102(e) Date: Jun. 17, 1991
[87] PCT Pub. No.: WO90/05980
 PCT Pub. Date: May 31, 1990

[30] Foreign Application Priority Data
Nov. 17, 1988 [DE] Fed. Rep. of Germany ....... 3838858

[51] Int. Cl.$^5$ .................. G11B 11/00; H01H 47/00
[52] U.S. Cl. ................................. 369/146; 369/13; 361/156; 360/66
[58] Field of Search .................. 369/146, 59, 13; 361/156, 155; 360/66, 114

[56] References Cited

U.S. PATENT DOCUMENTS

| | | | |
|---|---|---|---|
| 4,937,802 | 6/1990 | Omori et al. | 369/13 |
| 5,220,467 | 6/1993 | Zucker | 360/66 |
| 5,229,902 | 7/1993 | Zucker et al. | 360/114 |

FOREIGN PATENT DOCUMENTS

312143 4/1989 European Pat. Off. .

*Primary Examiner*—Paul M. Dzierzynski
*Assistant Examiner*—Kim-Kwok Chu
*Attorney, Agent, or Firm*—Max Fogiel

[57] ABSTRACT

A circuit arrangement for reversing a magnetic field, in which an oscillator has a coil connected in parallel with a capacitor. First and second diodes are connected oppositely-poled in a series circuit, which is connected in parallel with the coil and capacitor of said oscillator. A first electronic controlled switch is connected in parallel with the first diode for bypassing this diode, whereas a second electronic controlled switch is connected in parallel with the second diode for bypassing thereof. Energy is supplied to the oscillator whenever the capacitor discharges. The junction of the series connected diodes is connected to the junction of the series-connected switches.

9 Claims, 9 Drawing Sheets

MAGNETO-OPTICAL RECORDING CIRCUITRY FOR REVERSING A MAGNETIC FIELD

BACKGROUND OF THE INVENTION

The invention concerns circuitry for reversing field. Also see related U.S. Pat. Nos. 5,229,902 and 5,220,467

Circuitry of this kind is employed in magneto-optical recording and playback equipment for example to reverse the magnetism in the magnetic layer of a magneto-optical recording medium.

Magneto-optical disks are one known form of magneto-optical medium They have a transparent layer with a magneto-optical layer behind it. Information can be stored on and read from the latter. How information is stored on and read from a magneto-optical disk will now be described.

A laser beam focused on the disk heats the magneto-optical layer to a temperature in the vicinity of its Curie point. It is usually sufficient to heat the layer to approximately its compensation point, which is below the Curie point Behind the focal point on the disk is an electromagnet that magnetizes the area heated by the laser beam in one or the other direction. When the laser beam is turned off, the heated area will cool to below the compensation point again, and the magnetic direction established by the electromagnet will be retained, "freezing in." Individual bits are accordingly stored in domains of different magnetic direction, one corresponding to a logical ONE and the other to a logical ZERO.

The data are read out by exploiting the Kerr effect. The plane of polarization of a linearly polarized beam of light is rotated at a measurable angle when the beam if reflected by a magnetized mirror. The plane will be rotated right or left depending on the mirror's direction of magnetization. Since, however, the individual domains on the disk act like magnetized mirrors, the plane of polarization of any beam scanning the disk will be rotated right or left at a measurable angle.

From the rotation of the plane of polarization of the beam of light reflected from the disk, an optical pick-up can determine whether the bit being scanned is a ONE or a ZERO.

One known approach to magnetizing a magneto-optical layer in one direction or the other involves circuitry with a coil behind the magneto-optical disk that acts like an electromagnet. The coil is large enough to reverse the magnetism of the total area scanned by the optical pick-up. This area is, depending on the type of recording and playback equipment for example either a strip that is either radial or in the form of an arc of a circle and extends from the edge to the center of the disk. Since the field must attain a certain minimal strength over the total strip in order to reverse the strip's magnetism, the cross-section and hence the inductivity of the coil must be relatively large.

In another known approach, the coil is secured to the optical pick-up and can for example be wound around the pick-up's objective lens. Since the coil in this version is displaced along with the pick-up along the disk's information-storage tracks by a tracking circuit, a smaller cross-section and lower inductivity will generate an equivalent minimal field strength because it is not a radial or arc-shaped strip but only a small and for example circular area with the almost punctual laser spot as a center in the magneto-optical layer that is being magnetically reversed.

SUMMARY OF THE INVENTION

It is accordingly the object of the present invention to provide circuitry with a coil that will attain reliable and rapid reversal of the magnetic field.

The invention attains this object with a series of two oppositely poled diodes paralleling an oscillatory circuit comprising a coil and a capacitor, in that the first diode can be circumvented by an electronically controlled switch and the second diode by another electronically controlled switch, and in that energy is conveyed to the oscillatory circuit whenever the capacitor (C) discharges.

DESCRIPTION OF THE PREFERRED EMBODIMENTS

One embodiment of the invention will now be described and its function explained with reference to FIGS. 1 through 9.

Figure 1:
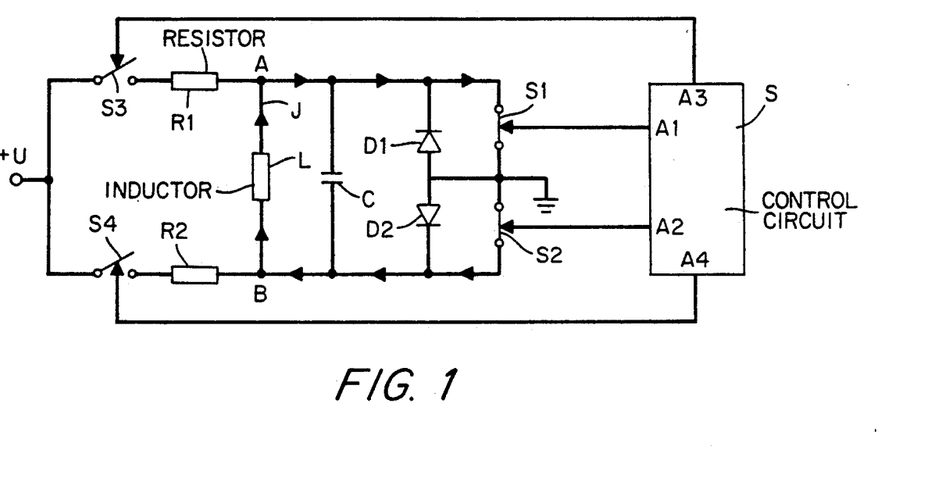
FIGS. 1 through 9 illustrate one embodiment of the invention in various states.

A series of two oppositely poled diodes D1 and D2 parallels an oscillatory circuit comprising a coil L and a capacitor C. Diode D1 can be circumvented by an electronically controlled switch S1 and diode D2 by an electronically controlled switch S2. One terminal A of the oscillatory circuit is connected to one pole of a source of voltage +U by a series comprising a resistor R1 and an electronically controlled switch S3. The other pole is connected to the junction of diodes D1 and D2. The other terminal B of the oscillatory circuit is also connected to the first pole of the source of voltage +U by a series comprising a resistor R3 and an electronically controlled switch S4.

A control circuit S with output terminals A1 to A4 connected to the control input terminals of electronically controlled switches S1 to S4 cyclically opens and closes the switches in a sequence that will now be described with reference to FIGS. 1 to 10. For simplicity's sake, control circuit S is not illustrated in FIGS. 2 through 9.

The electronically controlled switches S1 and S2 illustrated in FIG. 1 are closed and the electronically controlled switches S3 and S4 are open. For simplicity's sake and to facilitate comprehension of the invention it is assumed that coil L is a zero-loss inductor that is already supplied with magnetic energy. A current I is accordingly flowing through the circuit comprising coil L and electronically controlled switches S1 and S2 in the direction represented by the arrow. The function of source of voltage +U, of electronically controlled switches S3 and S4, and of resistors R1 and R2 will be discussed later herein.

Figure 2:
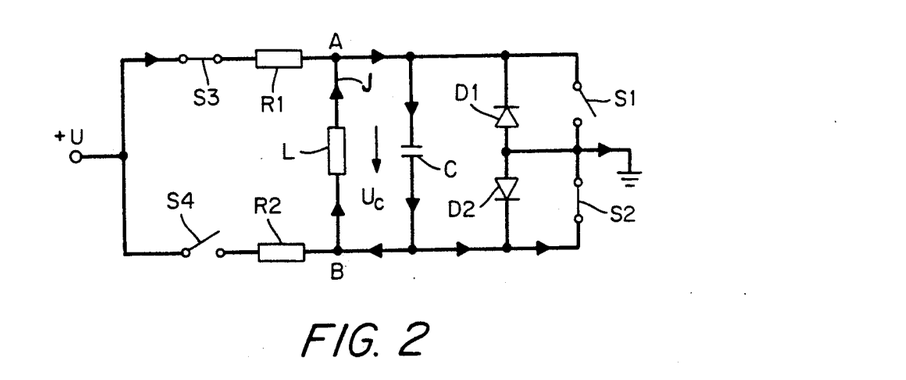
Figure 3:
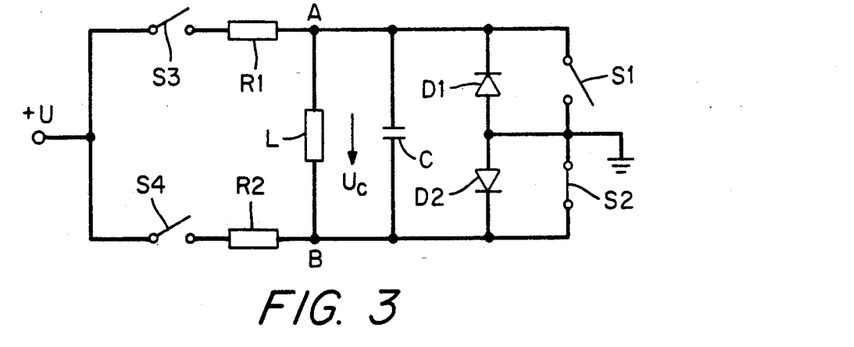
Figure 4:
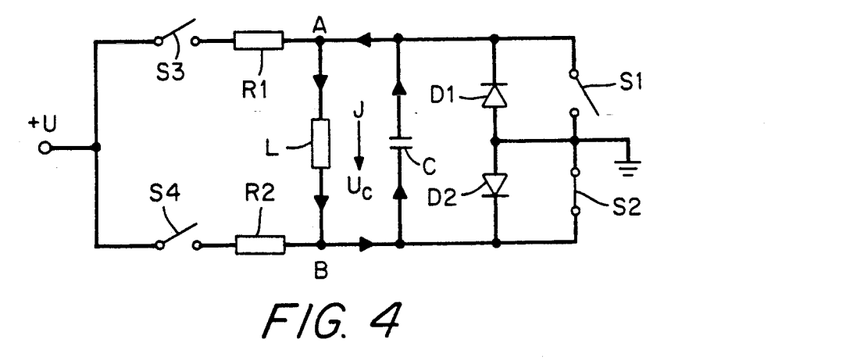
Figure 5:
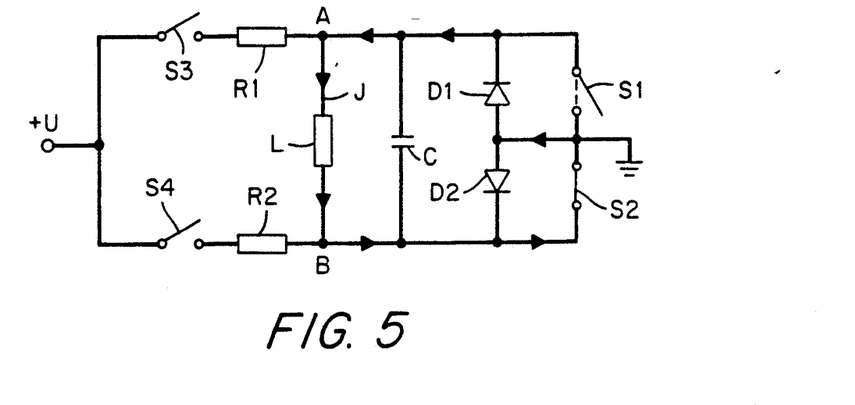

To reverse the magnetic field, control circuit S opens electronically controlled switch S1. Since the current through the branch paralleling coil L is now disengaged by electronically controlled switches S1 and S2, current I will now flow through capacitor C, which becomes charged as illustrated in FIG. 2. During the charging process, however, the current I through the coil decreases to zero when the voltage $U_c$ at capacitor C is maximal. This situation is illustrated in FIG. 3. Since capacitor C now begins to discharge, the current will flow through coil L in the other direction, represented by the arrow in FIG. 4. Once the voltage $U_c$ at capacitor C has decreased to zero, however, diode D1 will become conductive. Now, although current I will continue to flow through coil L in the same direction, it will no longer flow through capacitor C but through electronically controlled switch S2 and diode D1. This situation is illustrated in FIG. 5.

Figure 6:
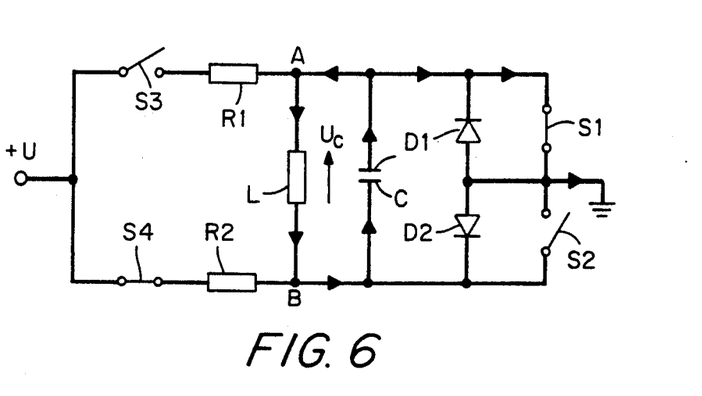
Figure 7:
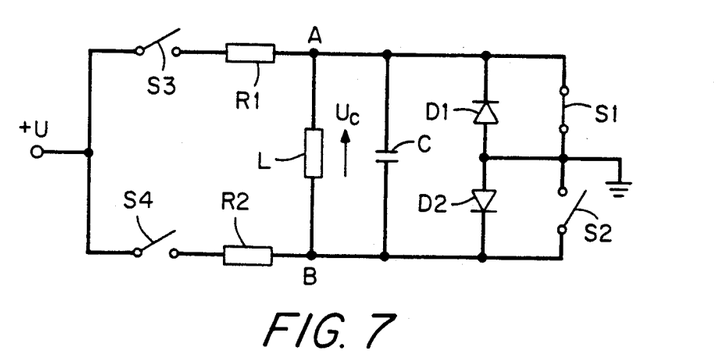

The control circuit S illustrated in FIG. 6 opens electronically controlled switch S2 and simultaneously closes electronically controlled switch S1. The capacitor is now charged in the opposite direction until its voltage $U_c$ is at a negative maximum, at which point the current I through coil L becomes zero, as illustrated in FIG. 7.

Figure 8:
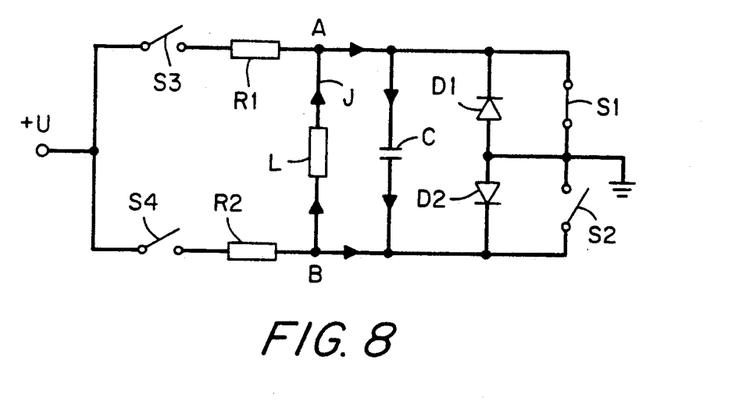

Since capacitor C is now discharging again, the current flowing through coil L reverses as illustrated in FIG. 8.

Figure 9:
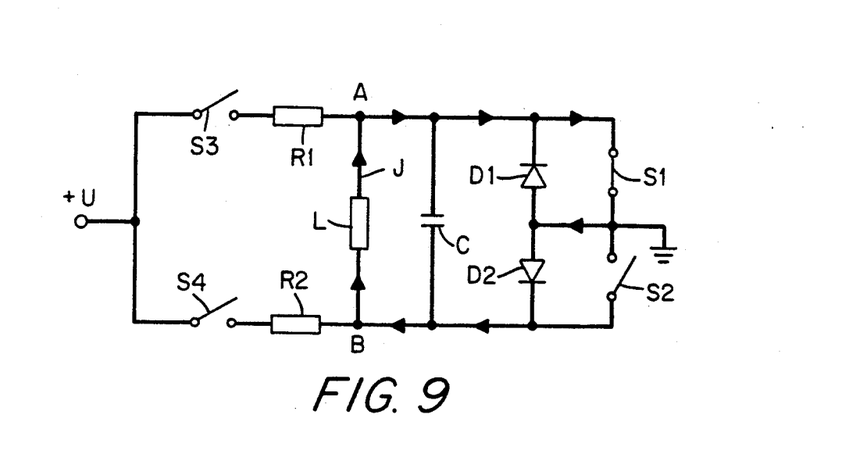

Once the voltage $U_c$ at capacitor C becomes zero, diode D2 becomes conductive. Current I will now flow, as illustrated in FIG. 9, through the loop comprising coil L, diode D2, and electronically controlled switch S1. Control circuit S now closes electronically controlled switch S2, and the initial state illustrated in FIG. 1 is restored.

Since coil L, capacitor C, diodes D1 and D2, and electronically controlled switches S1 and S2 are not actually zero-loss but have ohmic losses, energy must be supplied to the oscillatory circuit. Control circuit S will accordingly close electronically controlled switch S3 when electronically controlled switch S1 opens. As illustrated in FIG. 2, this action will connect the oscillatory circuit to the source of voltage +U. Control circuit S will also close electronically controlled switches S1 and S4 while opening electronically controlled switch S2. The oscillatory circuit is now likewise connected to the source of voltage +U. The situation is illustrated in FIG. 6.

Figure 10:
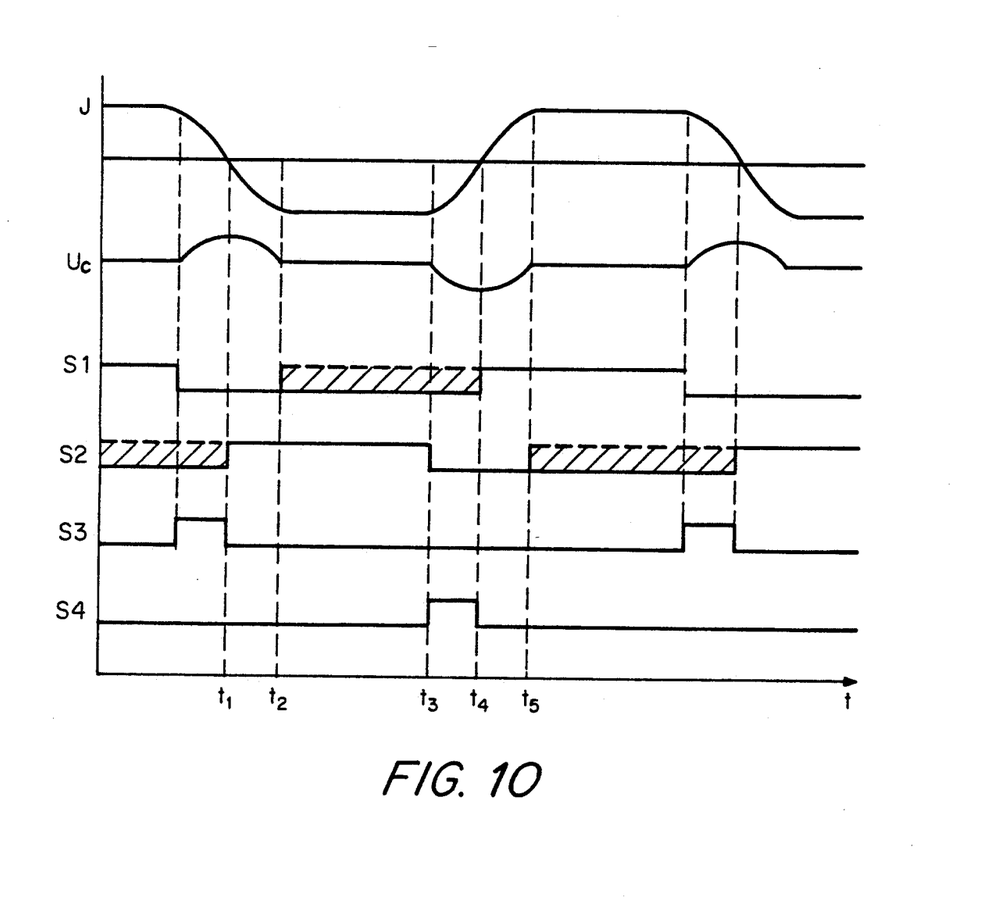
FIG. 10 is a graph of the state of the electronically controlled switch and of the current and voltage in that embodiment over time.

FIG. 10 illustrates the current I through coil L, the voltage $U_c$ at capacitor C, and the states of variable switches S1 to S4 as a function of time t. At t=0, electronically controlled switches S3 and S4 are open and electronically controlled switches S1 and S2 are closed. Electronically controlled switch S2, however, can also be open because diode D2 is conductive.

As previously explained herein, electronically controlled switch S1 is opened and electronically controlled switch S3 simultaneously closed in order to reverse the magnetic field. The current I through coil L decreases while the voltage $U_c$ at capacitor C increases. Voltage $U_c$ will be at a maximum when the current I through coil L is zero. At this time $t_1$, electronically controlled switch S3 opens again, and electronically controlled switch S2 must be closed by then. Current I now becomes negative, while voltage $U_c$ decreases to zero. Current I is now at its negative maximum. Electronically controlled switch S1 can be closed at this time $t_2$ or later. At time $t_3$, control circuit S opens electronically controlled switch S2 and simultaneously closes electronically controlled switch S4. Current I decreases to zero and the voltage $U_c$ at capacitor C becomes negative. The voltage $U_c$ at capacitor C is at a negative maximum while current I is zero. Electronically controlled switch S4 is opened again at this time $t_4$, and electronically controlled switch S1 must be closed by then. Current I continues to increase to its positive maximum while voltage $U_c$ decreases to zero. Electronically controlled switch S2 can at this time $t_5$ already be closed. In the hatched region, electronically controlled switches S1 to S4 can be in any state. Resistors R1 and R2 limit the current through the oscillatory circuit.

Another embodiment of the invention will now be described and its function explained with reference to FIGS. 11 and 12.

Figure 11:
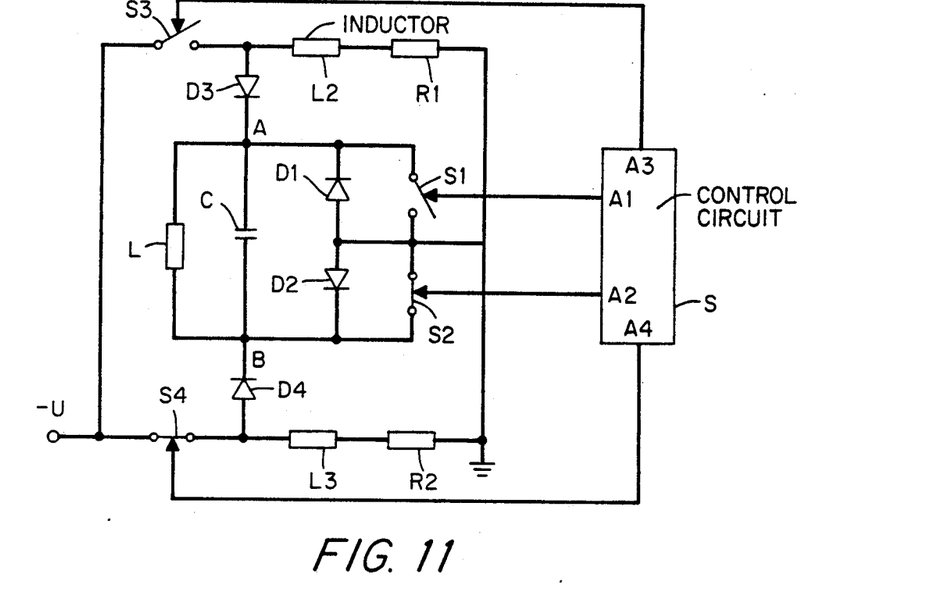
FIG. 11 illustrates another embodiment of the invention.

The second embodiment, illustrated in FIG. 11 differs from the first in how its energy is supplied. The parallel circuitry comprising the oscillatory circuit. diodes D1 and D2, and electronically controlled switches S1 and S2 is identical in structure with the first embodiment. One terminal A of the oscillatory circuit, however, is connected to one electrode of a diode D3, the other electrode of which is connected by way of electronically controlled switch S3 to one pole of a supply voltage −U and by way of a series of an inductance L2 and a resistor R1 to the other pole of the voltage. The other terminal B of the oscillatory circuit is similarly connected to one electrode of a diode D4, the other electrode of which is connected by way of electronically controlled switch S4 to the first pole of the voltage and by way of a series of an inductance L3 and a resistor R2 to the voltage's other pole FIG. 12 illustrates the current I through coil L, the voltage $U_c$ at capacitor C, and the states of electronically controlled switches S1 to S4 over time.

The current, voltage, and switch states correspond to those illustrated in FIG. 10. Energy is supplied, however, not by directly applying voltage to a source of supply voltage but by applying an inductive voltage. Electronically controlled switches S3 and S4 are accordingly always briefly opened when capacitor C is charged positively or negatively. The polarity of diodes D3 and D4 will ensure that current will flow through inductances L2 and L3 but not through the oscillatory circuit when electronically controlled switches S3 and S4 are closed.

Figure 12:
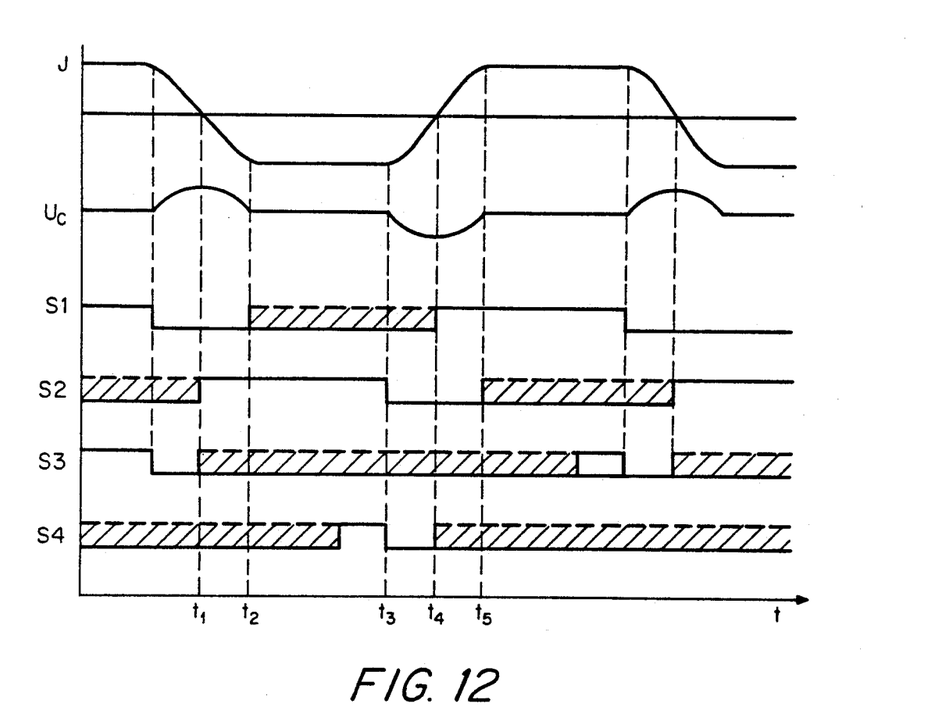
FIG. 12 is a graph of the state of the electronically controlled switch and of the current and voltage in the second embodiment over time.

The electronically controlled switch S3 illustrated in FIG. 12 is now opened at time $t_1$ when capacitor C is positively charged. Opening electronically controlled switch S3 will produce an induced voltage at inductance L2. The voltage is forwarded to capacitor C. Electronically controlled switch S2 can be closed again at or after time $t_2$, when voltage $U_c$ is at a maximum and current I is zero. Electronically controlled switch S4 is opened at time $t_3$, which capacitor C is negatively charged. The induced voltage at inductance L3 now equals the energy lost in the oscillatory circuit. Electronically controlled switch S4 can be closed again at or after time t4, when voltage $U_c$ is at its negative maximum. Electronically controlled switches S1 to S4 can be in any state in the hatched region. Resistors R1 and R2 act as current limiters as described with reference to the first embodiment. The advantage of the second embodiment over the first is that the high voltage that compensates for the energy lost in the oscillatory circuit is generated not by an external power supply but in a very simple way in an inductance. The supply voltage $-U$ in the second embodiment can accordingly be at least ten times lower than the voltage $+U$ in the first embodiment.

Figure 17:
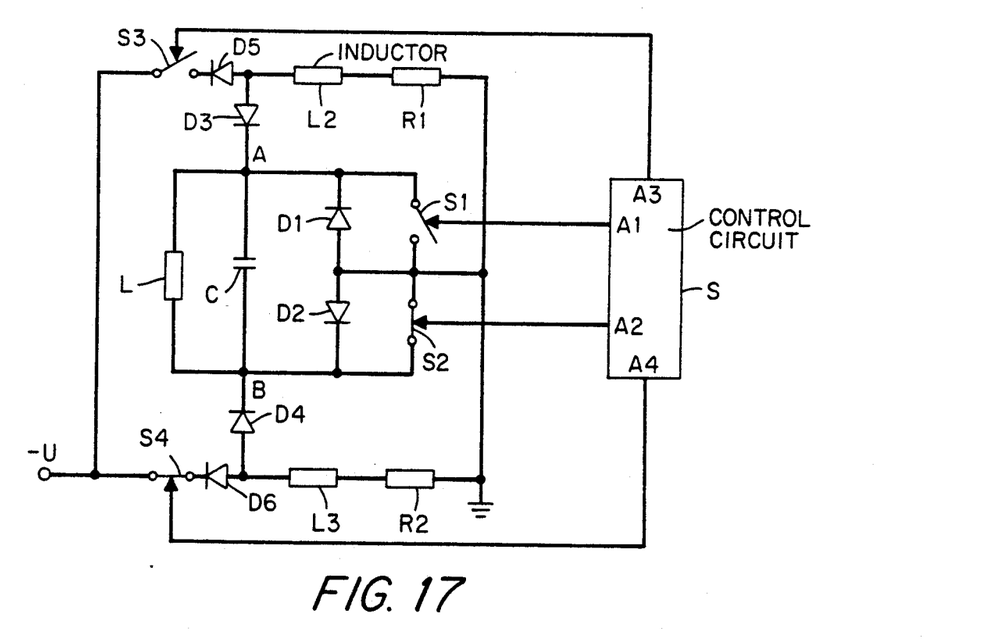
FIG. 17 illustrates a third embodiment of the invention.

The third embodiment of the invention, illustrated in FIG. 17, differs from the second, illustrated in FIG. 11, in that it has two more diodes D5 and D6 with opposite polarities. Diode D5 is positioned between electronically controlled switch S3 and the junction of diode D3 and inductance L2. Diode D6 is positioned between electronically controlled switch S4 and the junction of diode D4 and inductance L3.

When electronically controlled switches S3 and S4 have transistors, diodes D5 and D6 will accelerate the discharge of the parasitic capacity in inductances L2 and L3, as will now be explained with reference to the example of diode D5 and inductance L2.

When electronically controlled switch S3 is closed and its transistor accordingly conductive, a voltage $-U$ will be present at inductance L2, whereas the current thorough the inductance will be increasing linearly. As soon as electronically controlled switch S3 opens and the transistor is blocking, the induced voltage will rapidly maximize the potential at the terminal of inductance L2 that is connected to diodes D3 and D5 while the current flowing through inductance L2 will decrease to zero. The potential at the terminal of inductance L2 will then decrease, however, and, once it becomes zero, the current will be at a minimum. The potential will now decrease further, while the current through inductance L2 simultaneously returns to zero from the minimum. Without diode D5, however, it cannot become negative in relation to the negative pole of the source of supply voltage $-U$ because the diode of the transistor functioning as an electronically controlled switch will forward. Without diode D5 accordingly, the parasitic capacity in inductance L2 can discharge only slowly. When electronically controlled switch S3 closes again, the parasitic capacity will not have been completely discharged, and inductance L2 will accordingly not be completely without current. Diode D5 is intended to prevent this drawback in that, while it blocks the first terminal of inductance L2 off from the negative pole of the source of supply voltage $-U$, the potential at this node can be negative in relation to the negative pole of the source of supply voltage $-U$. The parasitic capacity of inductance L2 can accordingly discharge more rapidly, and inductance L2 will consequently become currentless more rapidly.

Skillful dimensioning of inductance L2 and a desirable triggering point for electronically controlled switch S3 will even make it possible to leave a residual current flowing through inductance L2 in the same direction when the switch is on as the current occasioned by the source of supply voltage $-U$. Due to this residual current, accordingly, the current in inductance L2 will increase to a maximum more rapidly than it would if there were no current in inductance L2 when electronically controlled switch S3 turns on.

The present invention is, as has already been mentioned herein, appropriate for reversing the magnetism of a magneto-optical recorded medium.

Information is stored on magneto-optical compact disks by an eight-to-fourteen modulation (EFM) code.

Figure 13:
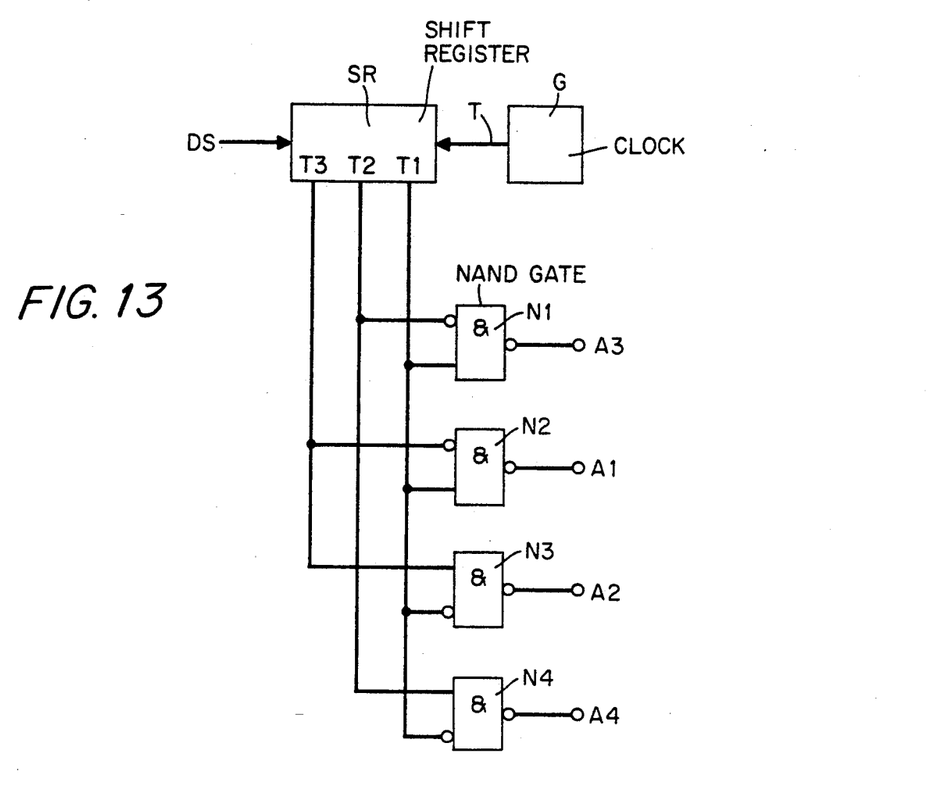
FIG. 13 illustrates an embodiment of a circuit for activating the electronically controlled switch.

FIG. 13 illustrates one embodiment of a circuit for activating electronically controlled switches S1 to S4, when information is supplied to them for storage.

The beat T obtained from a clock G is supplied, accompanied by a digital signal DS, which could for example be an EFM signal in a compact-disk player, to a shift register SR. Digital signal DS is at the first output terminal T1 of shift register SR, which is connected to the non-inverting input terminal of NAND gates N1 and N2 and to the inverting input terminal of NAND gates N3 and N4. A digital signal DS1, which has been delayed one beat T, is at the second output terminal T2 of shift register SR, which is connected to the inverting input terminal of NAND gates N1 and N4. Another digital signal DS2, which has been delayed two beats, is at the third output terminal T3 of shift register SR, which is connected to the inverting input terminal of NAND gates N2 and N3. The signal that controls electronically controlled switch S3 is at the output terminal of NAND gate N1, the signal that controls electronically controlled switch S2 is at the output terminal of NAND gate N2, the signal that controls electronically controlled switch S1 is at the output terminal of NAND gate N3, and the signal that controls electronically controlled switch S4 is at the output terminal of NAND gate N4.

Figure 14:
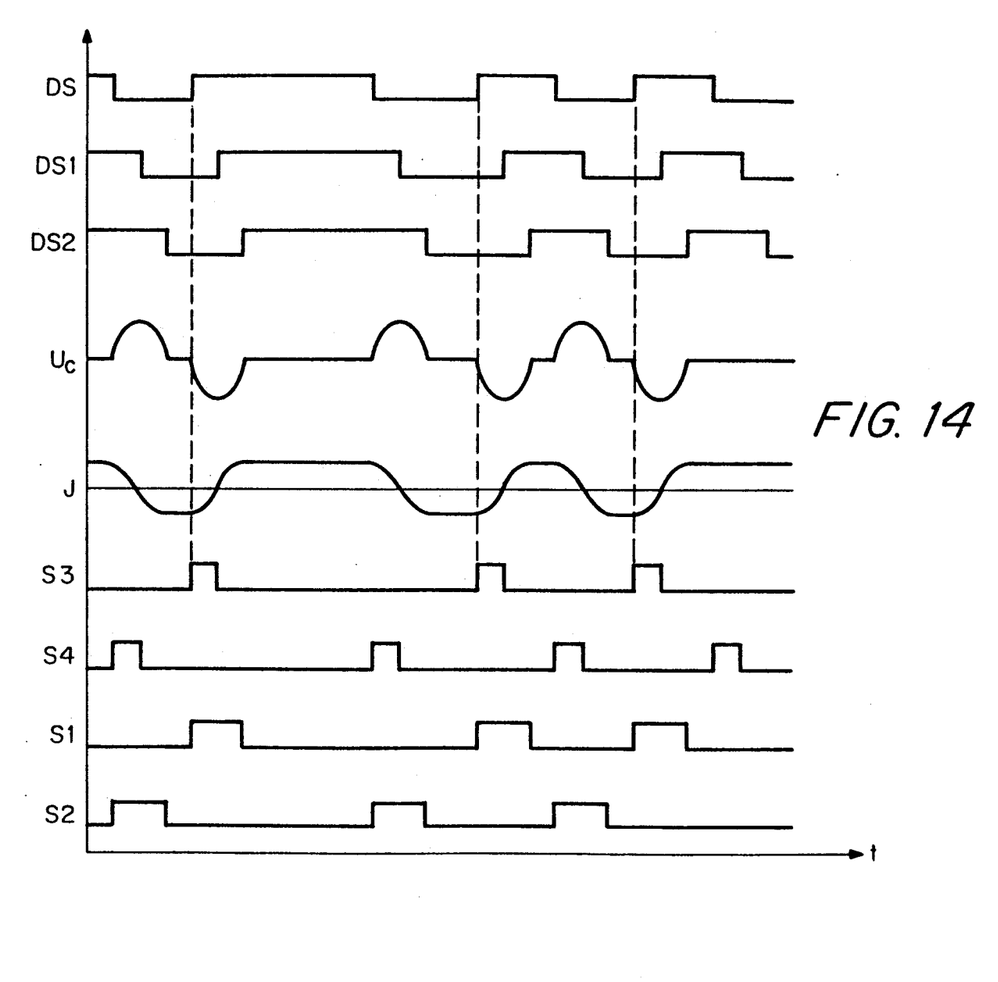
FIG. 14 is a graph of the signals that control the electronically controlled switch and of its current and voltage over time.

FIG. 14 illustrates digital signals DS, DS1, and DS2, the current I through coil L, the voltage $U_c$ at capacitor C, and the signals that control electronically controlled switches S1 to S4 over time. The digital signal can for example be an EFM-coded signal.

Figure 15:
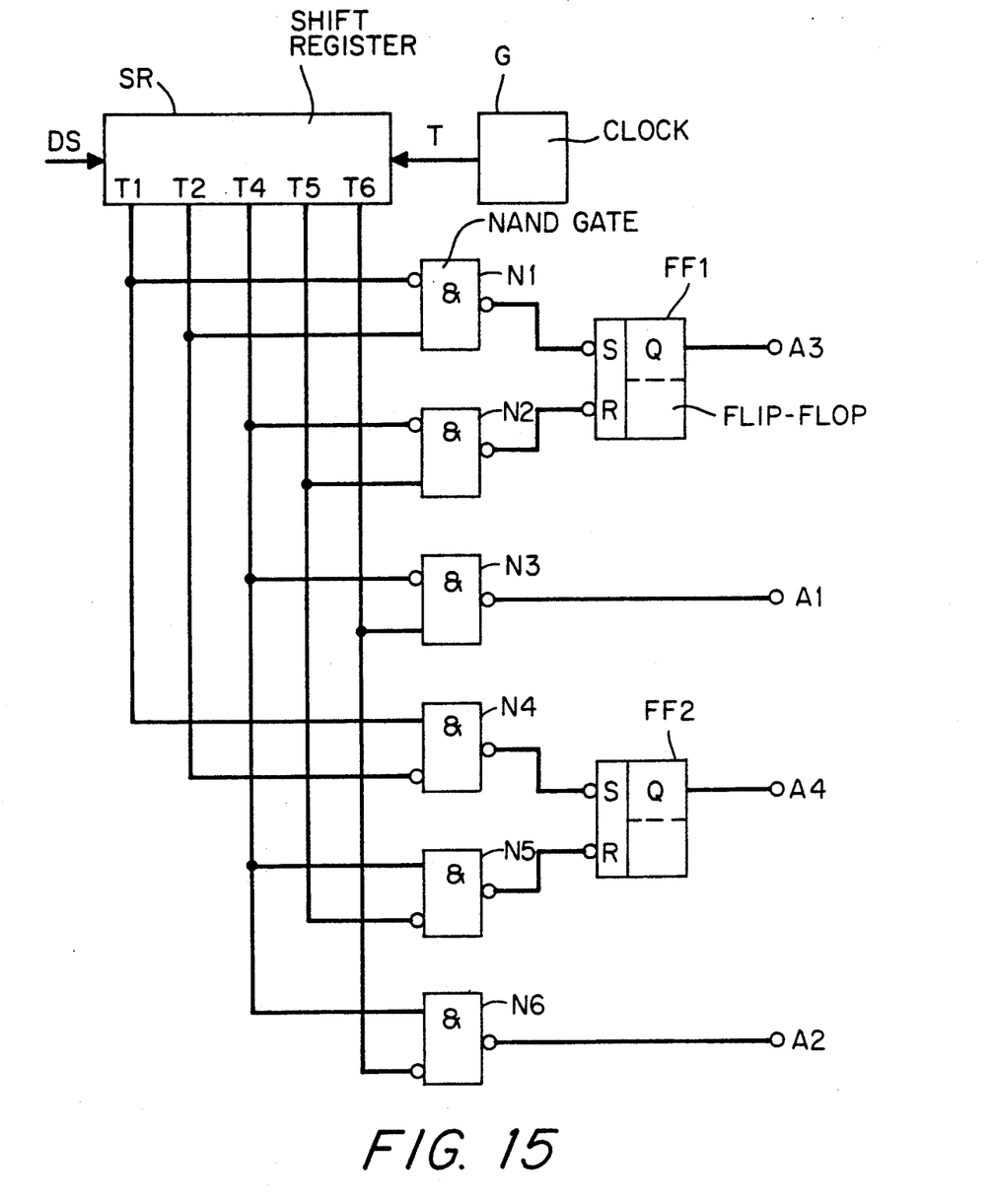
FIG. 15 is another embodiment of a circuit for activating the electronically controlled switch.

FIG. 15 illustrates another embodiment of circuitry for activating electronically controlled switches S1 to S4.

A data signal DS is again supplied to a shift register SR that is synchronized to a beat T obtained from a clock G. The output terminal T1 of shift register SR, which is supplied with a one-beat delayed data signal DS1, is connected to the inverting input terminal of a NAND gate N1 and to the non-inverting input terminal of a NAND gate N4. The output terminal T2 of shift register SR, which is supplied with the two-beat delayed data signal DS2, is connected to the non-inverting input terminal of NAND gate N1 and to the inverting input terminal of NAND gate N4. Output terminal T4, which is supplied with a four-beat delayed data signal DS4, is connected to the inverting input terminal of a NAND gate N2 and to the inverting input terminal of a NAND gate N3. An output terminal T5, which is supplied with a five-beat delayed data signal DS5, is connected to the non-inverting input terminal of a NAND gate N2 and to the inverting input terminal of a NAND gate N5. An output terminal T6, which is supplied with a six-beat delayed data signal DS6, is connected to the non-inverting input terminal of NAND gate N3 and to the inverting input terminal of NAND gate N6. The signal that controls electronically controlled switch S3 is at the Q output terminal of an RS flip-flop FF1, the setting input terminal of which is connected to the output terminal of NAND gate N1 and the resetting signal of which is connected to the output terminal of NAND gate N2. The signal that controls electronically controlled switch S4 is at the Q output terminal of an RS flip-flop FF2, the setting input terminal of which is connected to the output terminal of NAND gate N4 and the resetting input terminal of which is connected to the output terminal of NAND gate N5. The signal that controls electronically controlled switch S1 is at the output terminal of NAND gate N3 and the signal that controls electronically controlled switch S2 is at the output terminal of NAND gate N6. AND gates can be employed instead of NAND gates if the flip-flop respond to rising edges.

Figure 16:
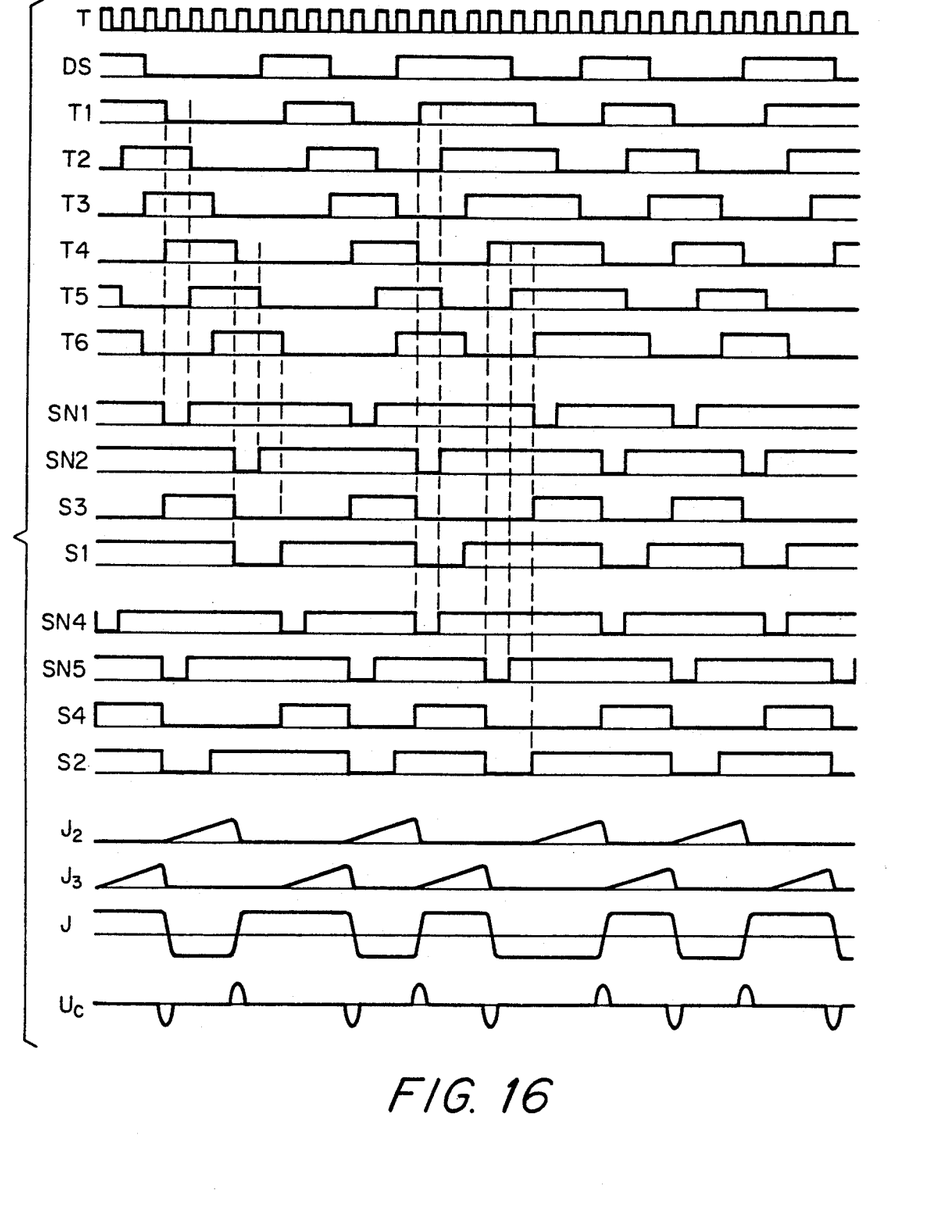
FIG. 16 is a graph of the signals that control that electronically controlled switch and of its current and voltage over time.

FIG. 1 illustrates beat T, the data signals DS and DS1 through DS5 at the output terminals T1 through T6 of shift register SR, the signal SN1 at the output terminal of NAND gate N1, the signal SN2 at the output terminal of NAND gate N2, the signal SN4 at the output terminal of NAND gate N4, the signal SN5 at the output terminal of NAND gate N5, the signals S1 through S4 that control electronically controlled switches S1 to S4, the current I2 through inductance L2, the current I3 through inductance L3, the current I through coil L, and voltage $U_c$ over time. Since one of skill in the art will be familiar with how NAND gates and flip-flops work, the pulses illustrated in FIG. 16 will not be discussed in detail.

The advantage of the invention in relation to magnetooptical recording and playback equipment is that information on the magneto-optical disk can be directly written over, whereas the information stored on disks employed with known magneto-optical equipment must be erased before new information can be stored.

The points in the magneto-optical layer where new information is to be stored is for this purpose heated by the laser to the compensation point, magnetizing them in one direction. The disk is "initialized" in technical terms. The direction of the magnetic field generated in the coil is then reversed.

To record new information, the laser output is switched from a low to a high value, depending on the bit being stored. If a logical ZERO for example is stored at the previously erased point, the laser will operate at a low output and the compensation point will not be attained. To enter a logical ONE on the other hand, the laser will heat the point to the compensation point, so that its magnetism can be reversed. Information must first be erased from the magneto-optical disk in this inconvenient way before new information can be entered.

The present invention is appropriate not only for magneto-optical equipment but for other magnetic recording equipment as well.

We claim:

1. A circuit arrangement for reversing a magnetic field, comprising: an oscillator having a coil connected in parallel with a capacitor; a first diode and a second diode connected in a series circuit, said series circuit being connected in parallel with said coil and said capacitor of said oscillator; said first diode having a cathode connected to one terminal of said capacitor and second diode having a cathode connected to another terminal of said capacitor; a first electronic controlled switch connected in parallel with said first diode for bypassing said first diode; a second electronic controlled switch connected in parallel with said second diode for bypassing said second diode, energy being supplied to said oscillator whenever said capacitor discharges, said first diode being connected to said second diode at a first junction, said first electronic controlled switch being connected to said second electronic controlled switch at a second junction, said first junction being connected to said second junction; means for connecting said first junction and said second junction to ground potential.

2. A circuit arrangement as defined in claim 1, wherein said energy is supplied to said oscillator galvanically.

3. A circuit arrangement for reversing a magnetic field, comprising: an oscillator having a coil connected in parallel with a capacitor; a first diode and a second diode connected in a series circuit, said series circuit being connected in parallel with said coil and said capacitor of said oscillator; said first diode having a cathode connected to one terminal of said capacitor and said second diode having a cathode connected to another terminal of said capacitor; a first electronic to controlled switch connected in parallel with said first diode for bypassing said first diode; a second electronic controlled switch connected in parallel with said second diode for bypassing said second diode, energy being supplied to oscillator whenever said capacitor discharges, said first diode being connected to said second diode at a first junction, said first electronic controlled switch being connected to said second electronic controlled switch at a second junction, said first junction being connected to said second junction; means for connecting said first and said second junction to ground potential to reverse the magnetic field, said first electronic controlled switch is opened, said second electronic controlled switch is closed before or when said capacitor has a voltage that increases to a maximum, and said first electronic controlled switch is closed when voltage at said capacitor has returned to zero from said maximum; to reverse the magnetic field again, said second electronic controlled switch is not opened until the voltage at the capacitor has decreased to zero from a maximum, said first electronic controlled switch being closed before or when the voltage at the capacitor increases to another maximum, and said second electronic controlled switch being closed when the voltage at the capacitor has decreased to zero again from the other maximum.

4. A circuit arrangement as defined in claim 3, including a control circuit for cyclically repeating switching with said first and second electronically controlled switches.

5. A circuit arrangement as defined in claim 4, including a third diode having one electrode connected to a first terminal of said oscillator; a third electronic controlled switch connected to another electrode of said third diode; a voltage source having a first terminal connected to said other electrode of said third diode through said third electronic controlled switch, said voltage source having a second terminal; a second coil connected between said other electrode of said third diode and said second terminal of said voltage source; a fourth diode having one electrode connected to a second terminal of said oscillator; a fourth electronic controlled switch connected between said first terminal of said voltage source and another electrode of said fourth diode; a third coil connected between said other electrode of said fourth diode and said second terminal of said voltage source; said control circuit closing said third electronic controlled switch for a predetermined length of time before said first electronic controlled switch opens and opening simultaneously with said first electronic controlled switch, said control circuit closing said fourth electronic controlled switch a predetermined length of time before said second electronic controlled switch opens and opening simultaneously with said second electronic controlled switch.

6. A circuit arrangement as defined in claim 5, including a fifth diode with polarity opposite to that of said third diode, said fifth diode having one terminal connected to said third electronic controlled switch and having another terminal connected to said other terminal of said third diode and said second coil; and a sixth diode with polarity opposite to that of said fourth diode, said sixth diode having one terminal connected to said fourth electronic controlled switch and having another terminal connected to the other terminal of said fourth diode and said third coil.

7. A circuit arrangement as defined in claim 4, including a third electronic controlled switch connected to a first terminal of said oscillator through a first resistor; a fourth electronic controlled switch connected to a second terminal of said oscillator through a second resistor; a voltage source having a first terminal connected to said third and fourth electronical controlled switches, said voltage source having a second terminal connected to said first junction of said first and second diodes; said control circuit closing said third electronic controlled switch when said first electronic controlled switch opens and said second electronic controlled switch is closed, said control circuit opening said third electronic controlled switch again when said capacitor is charged, said control circuit closing said fourth electronic controlled switch when said second electronic controlled switch is open and said first electronic controlled switch is closed, said control circuit opening said fourth electronic controlled switch again when said capacitor is charged.

8. A circuit arrangement as defined in claim 7, including a shift register with a digital signal input; a clock for synchronizing said shift register; a logic circuit with inputs connected to outputs of said shift register for combining said outputs of said shift register; said logic circuit having outputs for controlling said electronic controlled switches.

9. A circuit arrangement as defined in claim 7, including two RS flip-flops with inputs connected to four outputs of said logic circuit, said RS flip-flops having outputs for controlling two electronic controlled switches.

* * * * *